(12) United States Patent
Wang et al.

(10) Patent No.: US 11,022,654 B1
(45) Date of Patent: Jun. 1, 2021

(54) UNIVERSAL DRIVER SYSTEMS AND METHODS OF OPERATING THE SAME

(71) Applicants: University of Tennessee Research Foundation, Knoxville, TN (US); Keysight Technologies, Inc., Santa Rosa, CA (US)

(72) Inventors: Fei Wang, Knoxville, TN (US); Wen Zhang, Wuhan (CN); Bernhard Holzinger, Gaertringen (DE)

(73) Assignees: UNIVERSITY OF TENNESSEE RESEARCH FOUNDATION, Knoxville, TN (US); KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 16/817,105

(22) Filed: Mar. 12, 2020

(51) Int. Cl.
| | |
|---|---|
| *G01R 31/40* | (2020.01) |
| *H03K 17/693* | (2006.01) |
| *G01R 31/317* | (2006.01) |
| *G01R 31/319* | (2006.01) |
| *G06F 11/273* | (2006.01) |
| *G01R 31/28* | (2006.01) |
| *G01R 31/26* | (2020.01) |

(52) U.S. Cl.
CPC ........ *G01R 31/40* (2013.01); *G01R 31/2621* (2013.01); *G01R 31/2623* (2013.01); *G01R 31/2879* (2013.01); *G01R 31/31721* (2013.01); *G01R 31/31723* (2013.01); *G01R 31/31924* (2013.01); *G01R 31/31926* (2013.01); *G06F 11/2733* (2013.01); *H03K 17/693* (2013.01)

(58) Field of Classification Search
CPC .................................................. G06F 11/2733
See application file for complete search history.

(56) References Cited

U.S. PATENT DOCUMENTS

| | | | | |
|---|---|---|---|---|
| 8,427,182 B2* | 4/2013 | Amanuma | ......... | G01R 31/2839 324/750.01 |
| 10,498,212 B2* | 12/2019 | Chang | ...................... | H02M 1/08 |
| 2006/0186933 A1* | 8/2006 | Kimura | .................... | H02M 1/08 327/108 |
| 2013/0009671 A1* | 1/2013 | Suzuki | ................. | H03K 17/164 327/108 |

* cited by examiner

*Primary Examiner* — Thomas J. Hiltunen
(74) *Attorney, Agent, or Firm* — Myers Bigel, P.A

(57) ABSTRACT

A system includes a controller that is configured to generate a plurality of switch control signals; a plurality of electrical circuit elements, the plurality of electrical circuit elements being characterized by a plurality of impedances, respectively; a plurality of voltage sources; and a plurality of switches that are programmable to couple the plurality of electrical circuit elements to the plurality of voltage sources responsive to the plurality of switch control signals.

20 Claims, 8 Drawing Sheets

UNIVERSAL DRIVER SYSTEMS AND METHODS OF OPERATING THE SAME

STATEMENT REGARDING FEDERALLY SPONSORED RESEARCH OR DEVELOPMENT

This invention was made with government support under contract number EEC1041877 awarded by the National Science Foundation. The government has certain rights in the invention.

BACKGROUND

The present disclosure relates to power conversion circuits, and, in particular, to testing of power conversion circuits.

Power converter circuits may be used to convey power from a source, such as a battery, power supply, electrical power grid, etc. to a load, such as any device, apparatus, or component that runs on electricity preferably with as little loss as possible. Generally, a power converter circuit provides an output voltage that has a different level than the input voltage. One type of power converter circuit is a Direct Current to Direct Current (DC to DC) circuit. DC to DC power converters typically operate by temporarily storing input energy from a power source and then releasing that energy to an output load at a different voltage level. Switched mode DC to DC converter circuits are generally more power efficient than linear voltage regulators, which dissipate unwanted power as heat.

When developing new power converter devices, the circuits may be tested to evaluate their performance. The system used to test a power converter device may, however, need to be customized for the particular device under test. For example, a driver network including one or more impedances may be used with a voltage source to generate a voltage source or current source driver that is suitable for driving a device under test, which has a particular set of electrical characteristics. A second device under test, however, may possess a different set of electrical characteristics. As a result, the driver network and voltage source may need to be re-designed to drive the second device. In addition, the drive network and/or voltage source may need to be re-designed to drive a device under test in various ways, such as, for example, driving the device under test using a voltage source approach or driving the device under test using a current source approach.

SUMMARY

In some embodiments of the inventive concept, a system comprises a controller that is configured to generate a plurality of switch control signals; a plurality of electrical circuit elements, the plurality of electrical circuit elements being characterized by a plurality of impedances, respectively; a plurality of voltage sources; and a plurality of switches that are programmable to couple the plurality of electrical circuit elements to the plurality of voltage sources responsive to the plurality of switch control signals.

In other embodiments, a first subset of the plurality of circuit elements is coupled to a first output node and a second subset of the plurality of circuit elements is coupled to a second output node; a first subset of the plurality of switches are programmable to couple the first subset of the plurality of circuit elements to a first subset of the plurality of voltage sources responsive to a first subset of the plurality of switch control signals; and a second subset of the plurality of switches are programmable to couple the second subset of the plurality of circuit elements to a second subset of the plurality of voltage sources responsive to a second subset of the plurality of switch control signals.

In still other embodiments, the system further comprises a plurality of bypass switches coupled in parallel with the plurality of electrical circuit elements, respectively, each of the plurality of bypass switches being programmable in first and second states responsive to a bypass subset of the plurality of switch control signals. Respective ones of the plurality of electrical circuit elements are electrically removed when respective ones of the plurality of bypass switches are in the first state.

In still other embodiments, the plurality of switches comprises element configuration switches that are programmable to couple ones of the plurality of electrical circuit elements to each other in series and in parallel responsive to an element configuration subset of the plurality of switch control signals.

In still other embodiments, each of the plurality of impedances comprises a resistance, a capacitance, an inductance, a combination of resistance and capacitance, a combination of capacitance and inductance, or a combination of resistance, capacitance, and inductance.

In still other embodiments, the plurality of switches are programmable to couple one of the plurality of electrical circuit elements to one of the plurality of voltage sources in a voltage source driver configuration responsive to the plurality of switch control signals being in a voltage source configuration state.

In still other embodiments, the one of the plurality of circuit elements comprises a circuit including a resistor, a capacitor, an inductor, a combination of the resistor and the capacitor, a combination of the resistor and the inductor, a combination of the capacitor and the inductor, or a combination of the resistor, the capacitor, and the inductor. The one of the plurality of circuit elements is coupled to the one of the plurality of voltage sources.

In still other embodiments, a combination of the plurality of circuit elements comprises a resistor and a capacitor, the resistor and an inductor, the capacitor and the inductor, or the resistor, the inductor, and the capacitor. The combination of the plurality of circuit elements is coupled to one of the plurality of voltage sources.

In still other embodiments, the plurality of switches are programmable to selectively couple one of the plurality of electrical circuit elements to the plurality of voltage sources and to an output node in a multi-state current source driver configuration responsive to the plurality of switch control signals transitioning between a plurality of current source configuration states.

In still other embodiments, the one of plurality of circuit elements comprises an inductor; the inductor is coupled to one of the plurality of voltages sources and is configured to establish a current therethrough during a first portion of the plurality of current source configuration states; and the inductor is coupled to an output node and is configured to discharge the current through the output node during a second portion of the plurality of current source configuration states.

In still other embodiments, the inductor is decoupled from the one of the plurality of voltage sources during a third portion of the plurality of current source configuration states.

In still other embodiments, the third portion of the plurality of current source configuration states corresponds to a voltage at the output node being approximately equal to a voltage of the one of the plurality of voltage sources.

In still other embodiments, a first subset of the plurality of circuit elements is coupled to a first output node and a second subset of the plurality of circuit elements is coupled to a second output node. The first output node and the second output node are configured to couple to a device under test.

In still other embodiments, the first output node is configured to couple to a gate terminal of the device under test and the second output node is configured to couple to a source terminal of a device under test.

In some embodiments of the inventive concept, a method comprises generating a plurality of switch control signals; and programming a plurality of switches to couple a plurality of electrical circuit elements to a plurality of voltage sources responsive to the plurality of switch control signals, the plurality of electrical circuit elements being characterized by a plurality of impedances, respectively.

In further embodiments, a first subset of the plurality of circuit elements is coupled to a first output node and a second subset of the plurality of circuit elements is coupled to a second output node. The first output node and the second output node are configured to couple to a device under test.

In still further embodiments, the first output node is configured to couple to a gate terminal of the device under test and the second output node is configured to couple to a source terminal of a device under test.

In some embodiments of the inventive concept, a computer program product comprises a tangible computer readable storage medium comprising computer readable program code embodied in the medium that is executable by a processor to perform operations comprising: generating a plurality of switch control signals; and programming a plurality of switches to couple a plurality of electrical circuit elements to a plurality of voltage sources responsive to the plurality of switch control signals, the plurality of electrical circuit elements being characterized by a plurality of impedances, respectively.

In other embodiments, a first subset of the plurality of circuit elements is coupled to a first output node and a second subset of the plurality of circuit elements is coupled to a second output node. The first output node and the second output node are configured to couple to a device under test.

In still other embodiments, the first output node is configured to couple to a gate terminal of the device under test and the second output node is configured to couple to a source terminal of a device under test.

It is noted that aspects described with respect to one embodiment may be incorporated in different embodiments although not specifically described relative thereto. That is, all embodiments and/or features of any embodiments can be combined in any way and/or combination. Moreover, other methods, systems, articles of manufacture, and/or computer program products according to embodiments of the inventive subject matter will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims. It is further intended that all embodiments disclosed herein can be implemented separately or combined in any way and/or combination.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1:
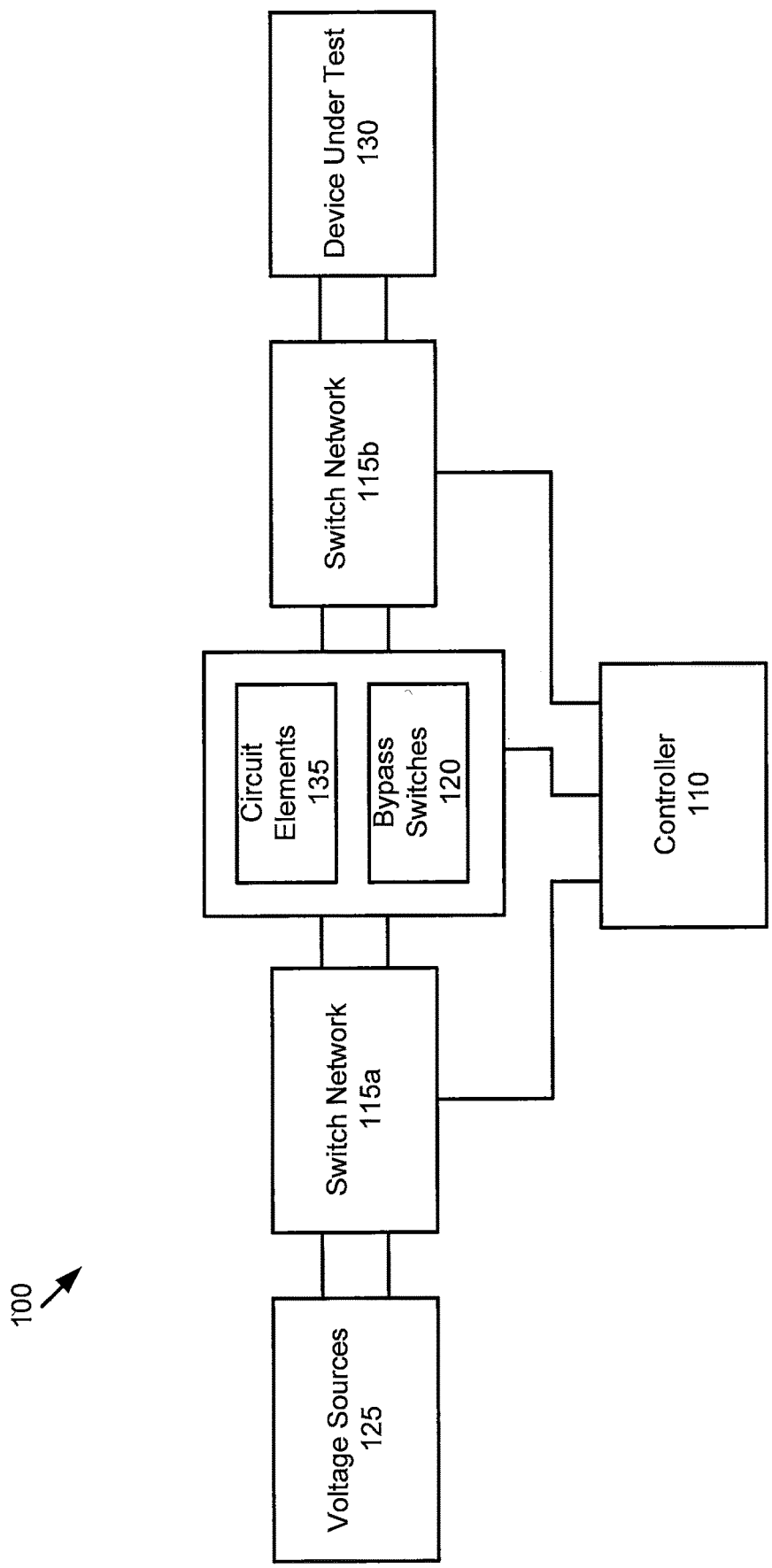
FIG. 1 is a block diagram that illustrates a network environment for a universal driver system in accordance with some embodiments of the inventive concept.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term a data processing system may include, but it is not limited to, a hardware element, firmware component, and/or software component.

As used herein, the term "device under test" refers to any electrical element, circuit, or system including, but not limited to, field effect transistors, bipolar junction transistors, and/or circuits and systems comprising the same. The electrical element(s) comprising a device under test may be in discrete form and/or as part of an integrated circuit.

Some embodiments of the inventive concept stem from a realization that when developing new electrical systems and circuits, such as power converter devices, for example, testing of such new systems, circuits, and devices may require a customized test environment. This may be due to different systems, circuits, and/or devices having different electrical characteristics. As a result, when performing testing operations, the voltage source and/or driver network used to drive one device under test may not effectively drive another device under test. Some embodiments of the inventive concept may provide a universal driver system that may be used to drive multiple types of devices under test without the need to design a custom driver circuit when the device under test changes. The universal driver system may include a network of programmable switches that can be used to couple one or more voltage sources to output terminals using a variety of types of impedance elements. The impedance elements may represent discrete elements, such as resistors, capacitors, and inductors, in some embodiments. In other embodiments the impedance elements may represent more complex circuits comprising any combination of resistor(s), capacitor(s), and inductor(s). The programmable switching network may also be configured to couple discrete impedance elements together to form various types of circuits. The programmable switches may also be configured to couple the voltage source(s) and impedance element(s) in a voltage source configuration, in a current source configuration, and/or in impedance source configuration. These configurations may be useful, for example, to drive power semiconductor devices as part of their testing/verification operations. Thus, embodiments of the inventive concept may reduce development and deployment costs for new electronic systems and devices, such as power semiconductor devices, for example, by providing a programmable universal driving system that can be used to test multiple devices, circuits, systems, and the like while reducing the need for customized driver circuits.

Referring to FIG. 1, a network environment for a universal driver system 100, according to some embodiments of the inventive concept, comprises a controller 110 that is coupled to a plurality of switches including switch networks 115a and 115b along with bypass switches 120. The switches in the switch networks 115a and 115b may be programmable to couple one or more voltage sources to a device under test 130, which may be any type of electrical device, component, and/or circuit. In some embodiments, the device under test 130 may be a power semiconductor device. For example, the switch network 115b may provide an interface to a gate and a source terminal of a power semiconductor device according to some embodiments of the inventive concept. The switch networks 115a and 115b may couple one of more of the voltage sources 125 to the device under test by way of one or more circuit elements 135. These circuit elements 135 comprise discrete components, such as individual resistors, capacitors, and inductors. In other embodiments, the circuit elements may comprise circuits including one or more components, such as resistors, capacitors, inductors, or other electrical components. Accordingly, the circuit elements 135 may be represented as impedances that may be coupled between the voltage sources 125 and the device under test 130 through the use of the programmable switches in the switch networks 115a and 115b, which are responsive to switch control signals generated by the controller 110. In some embodiments, the circuit elements 135 may have bypass switches 120 respectively associated therewith to remove the individual circuit elements 135 from a path while still maintaining a continuous electrical path. The switches described herein are illustrated as single throw switches. It will be understood, however, that other types of switches, such as double throw switches, may be used in other embodiments of the inventive concept.

The controller 110, therefore, may program the switches in the switch networks 115a and 115b along with the bypass switches 120 to create a variety of different configurations for driving a device under test 130 through a combination of one or more voltage sources 125 and circuit elements 135. These configurations may include, but are not limited to, a voltage source gate terminal/base terminal driver configuration where one or more voltage sources 120 are in series with a gate/base resistor, an impedance source gate terminal driver configuration where the gate/base resistor is substituted with a more complex resistor, capacitor, and/or inductor circuit, and/or a current source gate terminal/base terminal driver in which an inductor is used to establish a current that can be discharged into the gate terminal/base terminal and may also be used to resonate with the capacitance between the gate/source terminals or base/emitter terminals.

Figure 2:
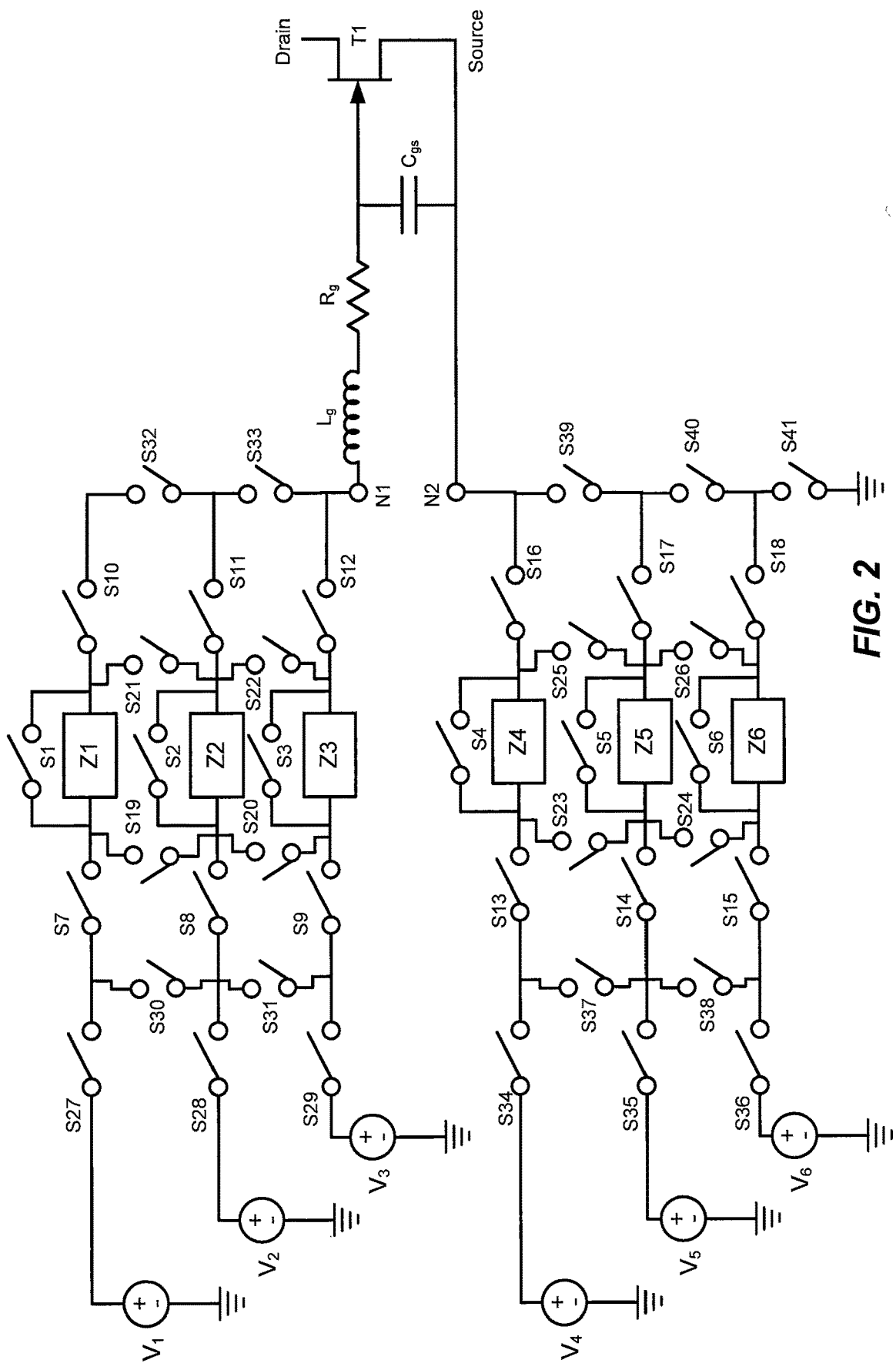
FIG. 2 is a schematic of the universal driver system coupled to a device under test in accordance with some embodiments of the inventive concept.

FIG. 2 is a schematic of the universal driver system coupled to a device under test in accordance with some embodiments of the inventive concept. The example universal driver system shown in FIG. 2 includes six primary branches voltage source and one or more circuit elements represented as an impedance. For example, three branches defined by voltage source and impedance pairs $V_1$ and $Z1$, $V_2$ and $Z2$, and $V_3$ and $Z3$ may be coupled to a first output node N1. Three other branches defined by voltage source and impedance pairs $V_4$ and $Z4$, $V_5$ and $Z5$, and $V_6$ and $Z6$ may be coupled to a second output node N2. The universal drive system, however, includes numerous switches that may form part of the switch networks 115a and 115 described above with respect to FIG. 1 to allow a wide variety of configurations for coupling the voltage sources $V_1$, $V_2$, and $V_3$ to the first output node N1 and the voltage sources $V_4$, $V_5$, and $V_6$ to the second output node N2. For example, switches S7, S8, S9, S10, S11, S12, S27, S28, and S29 may be used to make series connections along the three branches coupling the voltage source and impedance pairs $V_1$ and $Z1$, $V_2$ and $Z2$, and $V_3$ and $Z3$ to the first output node N1 responsive to switch control signals from the controller 110. Switches S19, S20, S21, S22, S30, S31, S32, and S33 may be used to make connections between the three branches coupling the voltage source and impedance pairs $V_1$ and $Z1$, $V_2$ and $Z2$, and $V_3$ and $Z3$ to the first output node N1 responsive to the switch control signals from the controller 110. Switches S1, S2, and S3 may be used to bypass impedance elements $Z1$, $Z2$, and $Z3$, respectively, to selectively remove them from an electrical path when the respective switch is closed responsive to the switch control signals from the controller 110.

Similarly, switches S13, S14, S15, S16, S17, S18, S34, S35, and S36 may be used to make series connections along the three branches coupling the voltage source and impedance pairs $V_4$ and $Z4$, $V_5$ and $Z5$, and $V_6$ and $Z6$ to the second output node N2 responsive to switch control signals from the controller 110. Switches S23, S24, S25, S26, S37, S38, S39, and S40 may be used to make connections between the three branches coupling the voltage source and impedance pairs $V_4$ and $Z4$, $V_5$ and $Z5$, and $V_6$ and $Z6$ to the second output node N2 responsive to the switch control signals from the controller 110. Switches S4, S5, and S6 may be used to bypass impedance elements $Z4$, $Z5$, and $Z6$, respectively, to selectively remove them from an electrical path when the respective switch is closed responsive to the switch control signals from the controller 110. Switch S41 may be used in conjunction with switches S39 and S40 to couple the second output node N2 to a ground or reference voltage responsive to the switch control signals from the controller 110.

A device under test may be coupled to the output terminals N1 and N2. In the example shown in FIG. 2, the device under test may be a power field effect transistor T1 having gate, drain and source terminals. The gate terminal may have an inductance Lg and a resistance Rg associated therewith. The gate-source junction may have a capacitance Cgs associated therewith.

As shown in the example embodiment of the universal driver system of FIG. 2, a large number of different voltages can be used to drive the power transistor T1. For example, with the node N2 coupled to ground, three different source voltages $V_1$, $V_2$, and $V_3$ may be used to drive the power transistor T1. The source voltages, however, may be combined to create nine additional possible voltage levels to drive the power transistor T1. That is, the voltage sources $V_1$, $V_2$, and $V_3$ may be combined with the voltage sources $V_4$, $V_5$, and $V_6$ in any combination to create nine different voltage level options. The various switches representing the switch networks 115a and 115b along with the bypass switches 120 provide an array of options for coupling the impedance elements Z1, Z2, and Z3 between the voltage sources $V_1$, $V_2$, and $V_3$ and the first output node N1 and the impedance elements Z4, Z5, and Z6 between the voltage sources $V_4$, $V_5$, and $V_6$ and the second output node N2. The impedance elements Z1, Z2, Z3, Z4, Z5, and Z6 may each represent individual circuit elements, such as resistors, capacitors, and resistors and/or may represent combination of circuit elements to form circuits having real and/or complex impedance characteristics. An impedance element Z1, Z2, Z3, Z4, Z5, and/or Z6 may also include one or more active elements, such as a transistor, or non-linear elements, such as a diode. Multiple ones of the impedance elements Z1, Z2, Z3, Z4, Z5, and/or Z6 may be coupled together using one or more switches to form a circuit with a desired impedance value. As described above, the voltage sources $V_1$, $V_2$, and $V_3$ and the voltage sources $V_4$, $V_5$, and $V_6$ may be coupled to the nodes N1 and N2, respectively, by combinations of the impedance elements Z1, Z2, and Z3 and the impedance elements Z4, Z5, and Z6, respectively, in desired configurations, such as a voltage source driver configuration, an impedance source driver configuration, and a current source driver configuration.

Although shown in FIG. 2 with six voltage sources, six impedance elements, and forty-one switches, it will be understood that embodiments of the inventive concept are not limited to any specific number of voltage sources, impedance elements, and/or switches.

Figure 3:
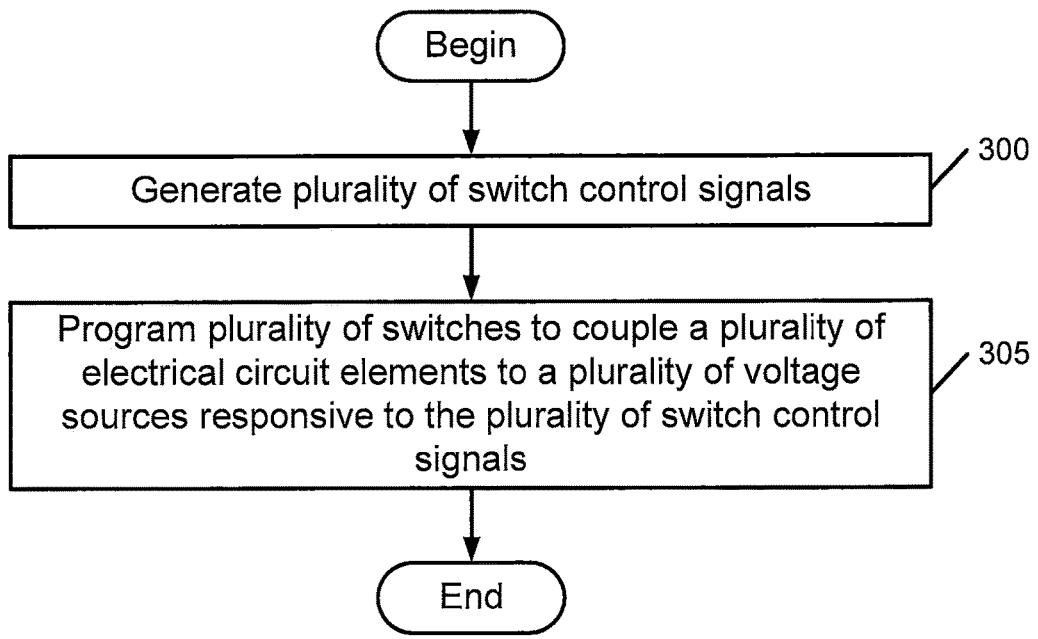
FIG. 3 is a flowchart that illustrates operations of the universal driver system in accordance with some embodiments of the inventive concept.

FIG. 3 is a flowchart that illustrates operations of the universal driver system in accordance with some embodiments of the inventive concept. Operations begin at block 300 where the controller 110 generates a plurality of switch control signals. A plurality of switches, e.g., switches in the switch networks 115a and 115b along with the bypass switches 120, may be programmed to couple circuit elements, such as circuit elements 135 (FIG. 1) and impedances Z1, Z2, Z3, Z4, Z5, and Z6 (FIG. 2), to a plurality of voltage sources, such as voltage sources 125 (FIG. 1) and voltage sources $V_1$, $V_2$, and $V_3$, $V_4$, $V_5$, and $V_6$.

Figure 4:
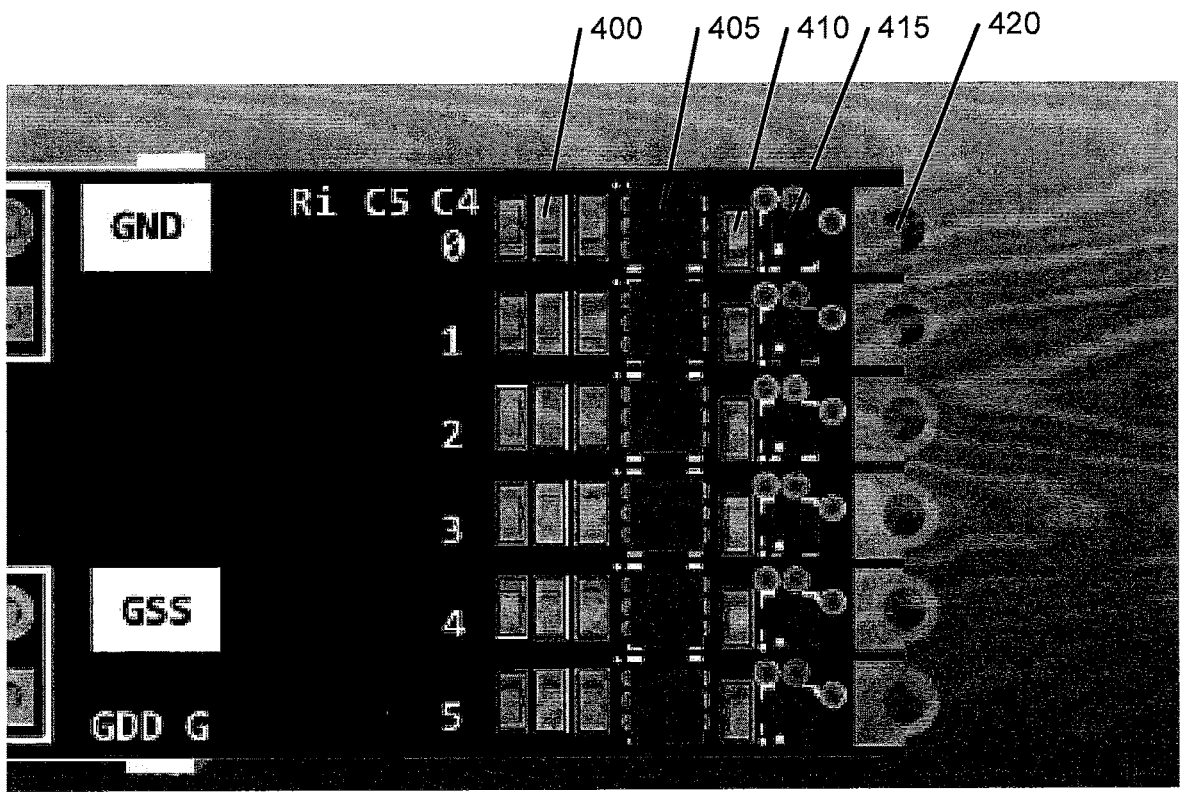
FIG. 4 is a plan view of a printed circuit board layout of the universal driver system in accordance with some embodiments of the inventive concept.

FIG. 4 is a plan view of a printed circuit board layout of the universal driver system in accordance with some embodiments of the inventive concept. As shown in FIG. 4, six branches 0 through 5 are shown, which may represent the six branches represented by voltage sources $V_1$, $V_2$, $V_3$, $V_4$, $V_5$, and $V_6$ of FIG. 2. The voltage sources $V_1$, $V_2$, $V_3$, $V_4$, $V_5$, and $V_6$ may be supplied off-board and may couple to the respective branches at interface terminals 400 and the GND terminal. Modules 405 and 410 are a driving integrated circuit and a resistor for each switch 415, respectively. The impedances Z1, Z2, Z3, Z4, Z5, and Z6 may be provided off-board and may couple to the respective branches at interface terminals 420.

Figure 5:
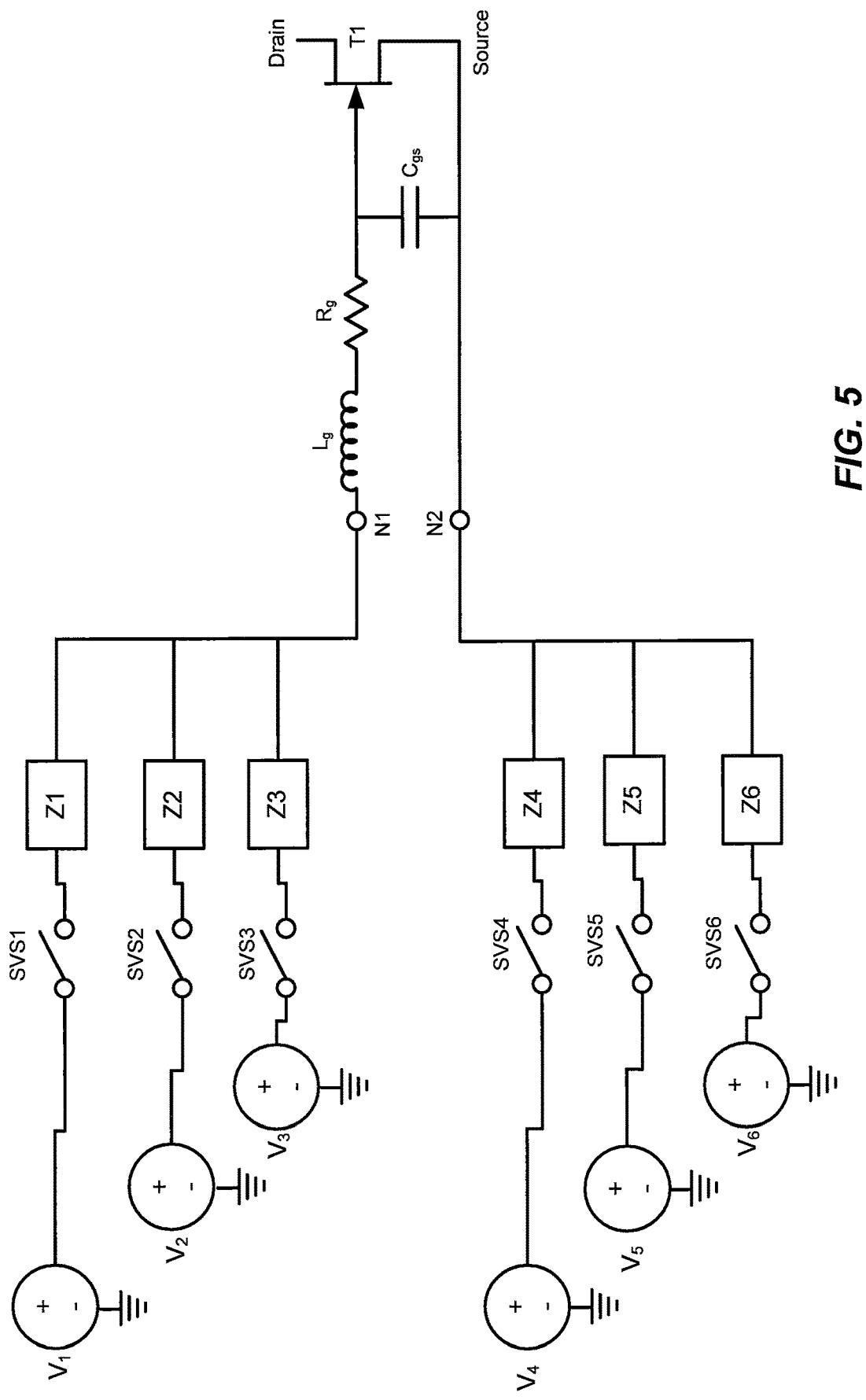
FIG. 5 is a schematic of the universal driver system configured as a voltage source driver in accordance with some embodiments of the inventive concept.

As described above, the universal driver system may be configured as a voltage source driver in accordance with some embodiments of the inventive concept. FIG. 5 is a schematic of the universal driver system configured as a voltage source driver in accordance with some embodiments of the inventive concept. Referring to FIG. 5, the universal driver system configured as a voltage source driver includes three voltage sources $V_1$, $V_2$, and $V_3$, which are coupled to a first output node N1 by way of switches SVS1, SVS2, and SVS3 and impedances Z1, Z2, and Z3, respectively. The impedances Z1, Z2, and Z3 may each be embodied as one or more resistors. In other embodiments, one or more of the impedances Z1, Z2, and Z3 may be implemented as a more complex circuit including, for example, one or more inductors or capacitors. When an impedance Z1, Z2, and Z3 is implemented using circuit elements other than a resistor, the circuit may be termed an impedance source driver instead of a voltage source driver.

As shown in FIG. 5, the voltage source driver further includes three voltage sources $V_4$, $V_5$, and $V_6$, which are coupled to a second output node N2 by way of switches SVS4, SVS5, and SVS6 and impedances Z4, Z5, and Z6, respectively. Similar to the impedances Z1, Z2, and Z3, the impedances Z4, Z5, and Z6 may each be embodied as one or more resistors. In other embodiments, one or more of the impedances Z4, Z5, and Z6 may be implemented as a more complex circuit including, for example, one or more inductors or capacitors to configure the circuit as an impedance source driver. That is, according to some embodiments of the inventive concept, the impedances Z1, Z2, Z3, Z4, Z5, and Z6 may each be implemented as one or more resistors to implement a voltage source driver or any of the impedances Z1, Z2, Z3, Z4, Z5, and Z6 may be implemented as a circuit including, for example, one or more inductors and/or capacitors to implement the circuit as an impedance source driver. The switches SVS1, SVS2, SVS3, SVS4, SVS5, and SVS6 may each be configured in an opened or closed state responsive to respective switch control signals generated by, for example, the controller 110 of FIG. 1 to connect respective ones of the voltage sources $V_1$, $V_2$, $V_3$, $V_4$, $V_5$, and $V_6$ to the output nodes N1 or N2 via the impedances Z1, Z2, Z3, Z4, Z5, and Z6.

Similar to FIG. 2, a device under test may be coupled to the output terminals N1 and N2. The device under test may be a power field effect transistor T1 having gate, drain and source terminals. The gate terminal may have an inductance Lg and a resistance Rg associated therewith. The gate-source junction may have a capacitance Cgs associated therewith. The potentials applied to the output nodes N1 and N2 may be used to charge the gate-source junction with a time constant based on the capacitance Cgs and the gate resistance Rg along with any resistors associated with the impedances Z1, Z2, Z3, Z4, Z5, and Z6 that are coupled into the circuit using the switches SVS1, SVS2, SVS3, SVS4, SVS5, and SVS6.

In the example voltage source driver shown in FIG. 5, three branches are used to couple three different voltage sources to output node N1 and three branches are used to couple three different voltage sources to output node N2. This may allow for nine different potential differences to be applied at the output nodes N1 and N2 to drive the device under test, i.e., the transistor T1. It will be understood, however, that more or fewer voltage sources and branches may be used to implement the voltage source driver in accordance with various embodiments of the inventive concept. For example, in perhaps its simplest form, a voltage source driver may be configured, such that the node N2 is coupled to ground or other reference potential and a single source voltage is applied to the output terminal N1 through a series combination of a resistor and switch.

Figure 6:
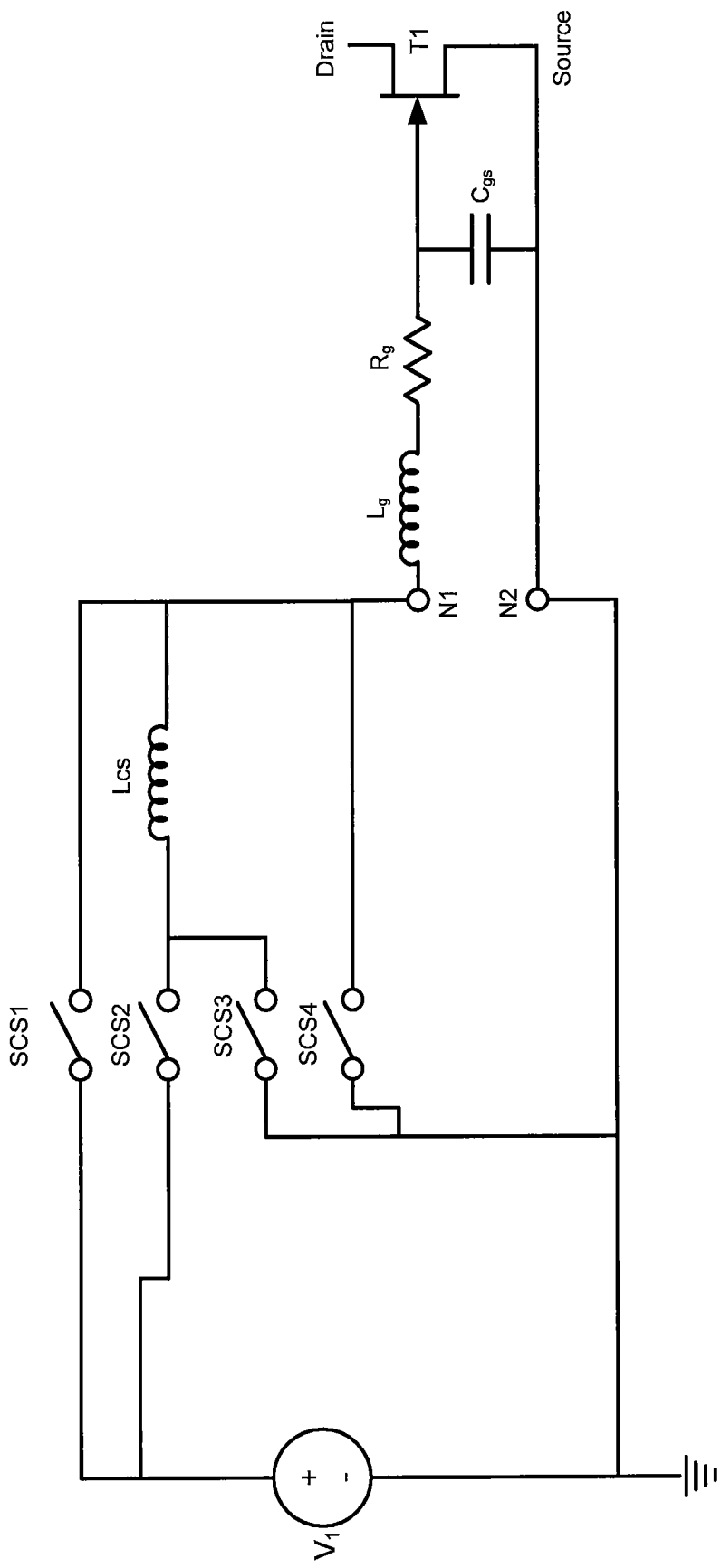
FIG. 6 is a schematic of the universal driver system configured as a current source driver in accordance with some embodiments of the inventive concept.
Figure 7:
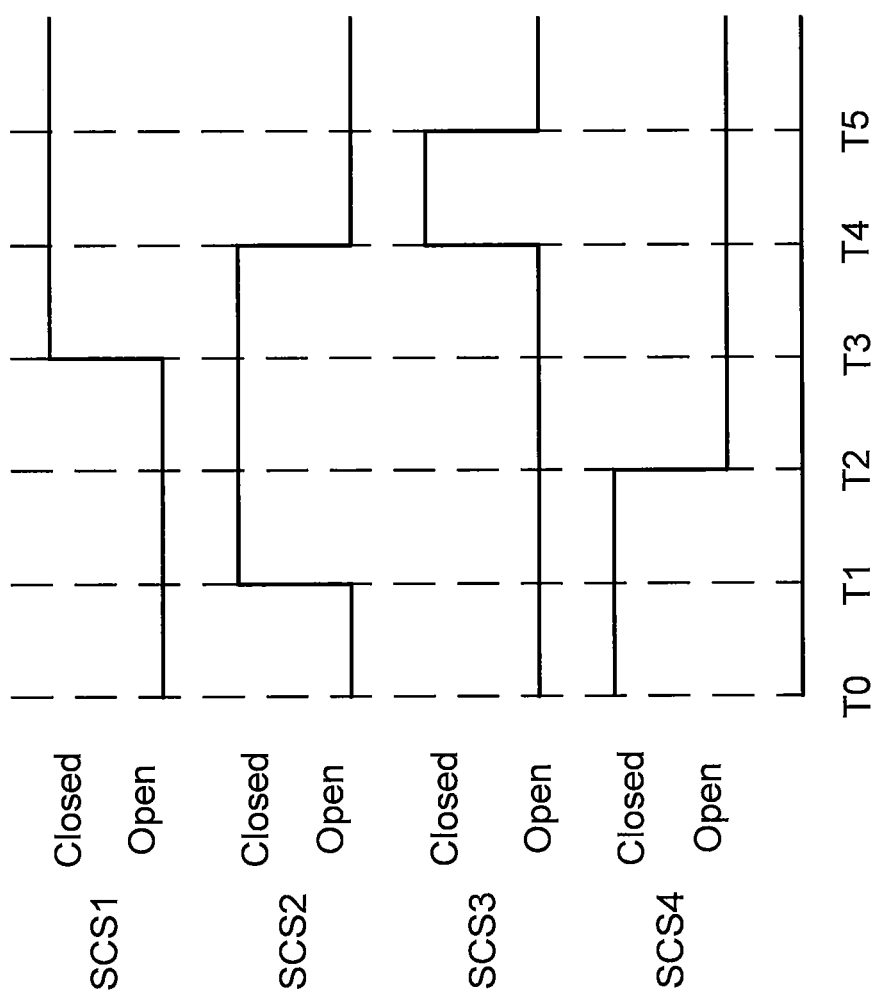
FIG. 7 is a timing diagram that illustrates operations of the universal driver system configured as a current source driver in accordance with some embodiments of the inventive concept.
Figure 8:
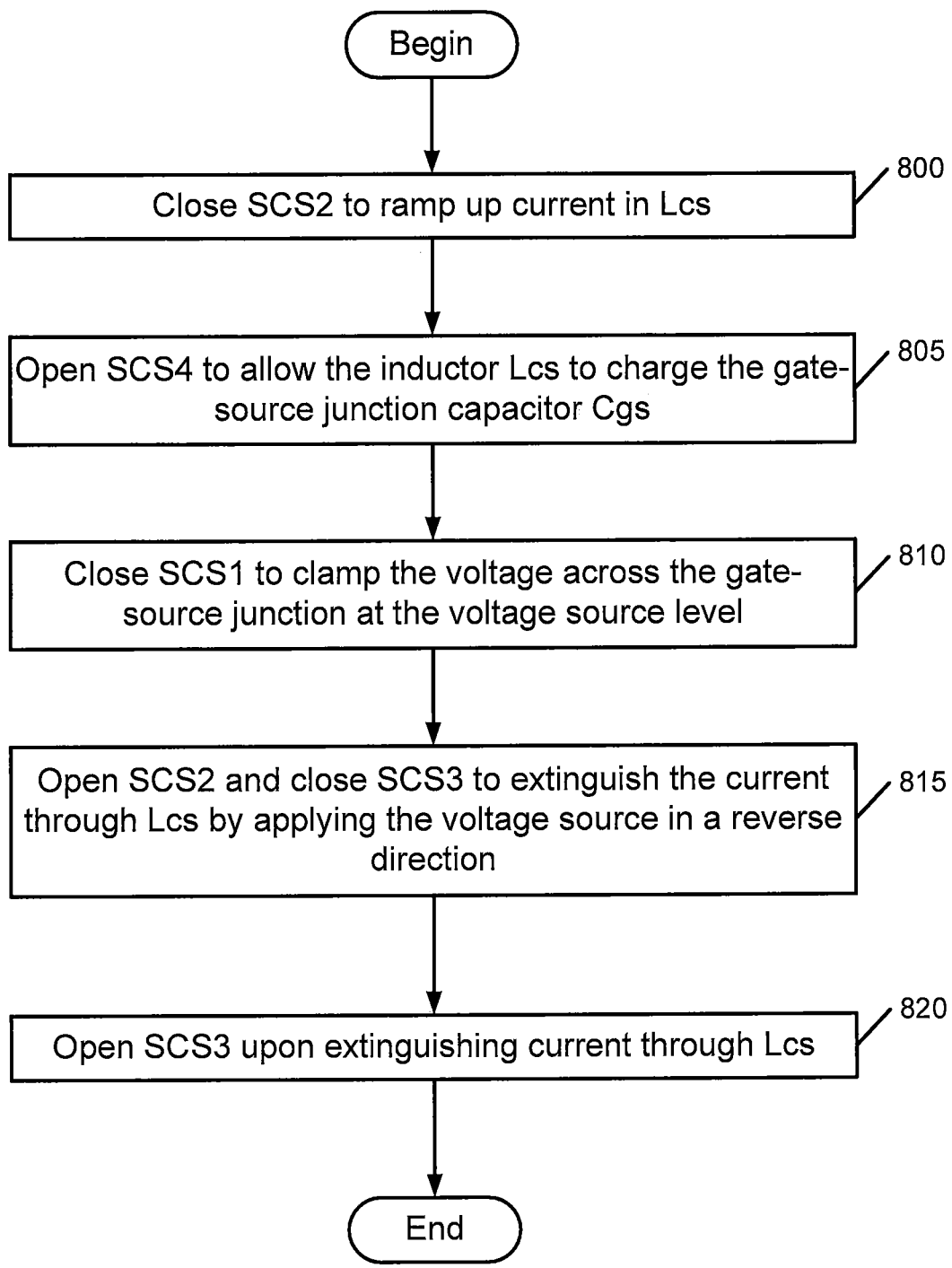
FIG. 8 is a flowchart that illustrates operations of the universal driver system configured as a current source driver in accordance with some embodiments of the inventive concept.

As described above, the universal driver system may be configured as a current source driver in accordance with some embodiments of the inventive concept. FIG. 6 is a schematic of the universal driver system configured as a current source driver in accordance with some embodiments of the inventive concept. FIG. 7 is a timing diagram that illustrates operations of the universal driver system configured as a current source driver in accordance with some embodiments of the inventive concept. FIG. 8 is a flowchart that illustrates operations of the universal driver system configured as a current source driver in accordance with some embodiments of the inventive concept. Referring to FIG. 6, the universal driver system configured as a current source driver includes a single voltage source $V_1$ that is coupled to a single circuit element/impedance element Z that is implemented as an inductor Lcs. A plurality of switches SCS1, SCS2, SCS3, and SCS4 are configured to couple the voltage source $V_1$ to the inductor Lcs and the first output node N1. The switches SCS1, SCS2, SCS3, and SCS4 are responsive to switch control signals generated by the controller 110 of FIG. 1 to change their states between open and closed. The voltage source $V_1$ and second output node N2 are connected to a common ground or reference potential. Similar to FIG. 2, a device under test may be coupled to the output terminals N1 and N2. The device under test may be a power field effect transistor T1 having gate, drain and source terminals. The gate terminal may have an inductance Lg and a resistance Rg associated therewith. The gate-source junction may have a capacitance Cgs associated therewith.

Operations of the universal driver system configured as a current source driver, in accordance with some embodiments of the inventive concept, will now be described with reference to FIGS. 7 and 8. As shown in FIG. 7, all three switches SCS1, SCS2, and SCS3 begin at time T0 in an open state effectively disconnecting the voltage source V1 from the inductor Lcs and the output node N1. Switch SCS4 is closed to clamp the gate-source junction voltage to zero or other ground/reference potential. Under operation of the controller 110, at time T1, switches SCS2 and SCS4 are closed to ramp up the current in the inductor Lcs (FIG. 8; block 800). At time T2, switch SCS4 is opened to allow the current established in the inductor Lcs to charge the gate-source junction capacitor Cgs (FIG. 8; block 805). As the voltage increases at the output terminal N1, the switch SCS1 is closed at time T3 to clamp the voltage across the gate-source junction at the level of the voltage source $V_1$ (FIG. 8, block 810). At time T4, switch SCS2 is opened and switch SCS3 is closed in synchronization with each other to extinguish the current through the inductor Lcs by applying the voltage source $V_1$ across the inductor Lcs in the reverse direction than was applied at block 805 of FIG. 8 (FIG. 8; block 815). The universal driver system configured as a current source driver transitions to a steady state at time T5 by opening switch SCS3 after extinguishing the current through the inductor Lcs. (FIG. 8; block 820). Switch SCS1 remains closed to clamp the gate-source junction voltage at the voltage source level $V_1$. Before starting a new driving operation test, switch SCS1 is opened and switch SCS4 is closed to allow the gate-source junction capacitor Cgs to discharge the charge stored thereon through the switch SCS4 based on a time constant associated with the gate-source junction capacitor Cgs and the gate resistance Rg.

Figure 9:
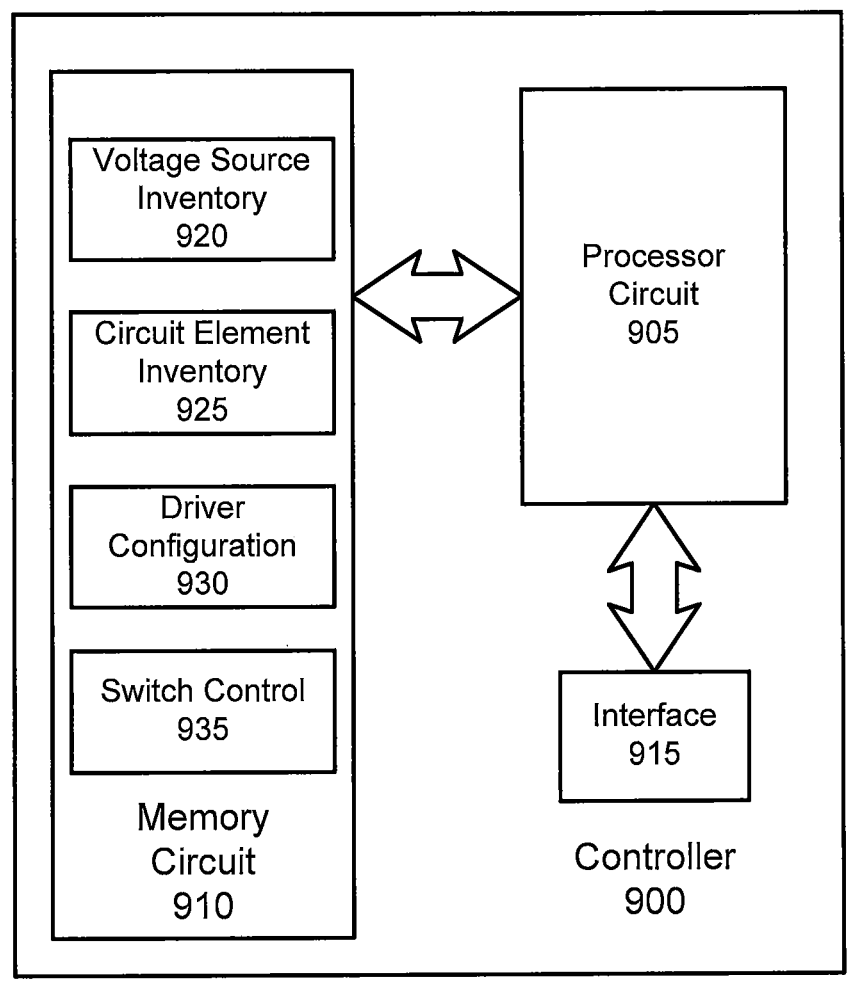
FIG. 9 is a simplified block diagram of the controller used in the universal driver system of FIG. 1 in accordance with some embodiments of the inventive concept.

FIG. 9 is a simplified block diagram of the controller 110 used in the universal driver system of FIG. 1 that is configured to perform operations according to one or more embodiments disclosed herein in accordance with some embodiments of the inventive concept. The controller 900 comprises a processor circuit 905, a memory circuit 910, and an interface 915. The interface may comprise a wireless and/or a wired interface, such as a wireless transceiver and a network adapter. The wireless transceiver and the network adapter may be configured to provide the controller 900 with wireless and wireline communication functionality, respectively. In some embodiments, the interface 915 may support a Joint Test Action Group (JTAG) port for communication. The processor circuit 905 may comprise one or more data processing circuits, such as a general purpose and/or special purpose processor, e.g., microprocessor and/or digital signal processor. The processor circuit 905 is configured to execute computer readable program code including a voltage source inventor module 920, a circuit element inventory module 925, a driver configuration module 930, and a switch control module 935 in the memory circuit 910 to perform at least some of the operations described herein as being performed by the controller 110. The voltage source inventory module 920 may be configured to define the voltage sources, e.g., voltage sources 125 of FIG. 1 and voltage sources $V_1$, $V_2$, $V_3$, $V_4$, $V_5$, and $V_6$ of FIG. 2, which are used in the universal driver system. The circuit element inventory module 925 may be used to define the circuit elements, e.g., the circuit elements 135 of FIG. 1 and the impedance elements Z1, Z2, Z3, Z4, Z5, and Z6 of FIG. 2, which are used in the universal driver system. The driver configuration module 830 may be configured to define various configurations of the switches e.g., switches of switch networks 115a and 115b and bypass switches 120 of FIG. 1 and switches S1 through S41 of FIG. 2, to provide a specific voltage source and circuit element/impedance combination for use in driving a device under test. The switch control module 935 may be configured to generate the switch control signals to configure the various switches in open and closed states to implement the various desired configurations of voltage sources, e.g., voltage sources 125 of FIG. 1 and voltage sources $V_1$, $V_2$, $V_3$, $V_4$, $V_5$, and $V_6$ of FIG. 2 and circuit elements/impedances, e.g., the circuit elements 135 of FIG. 1 and the impedance elements Z1, Z2, Z3, Z4, Z5, and Z6 of FIG. 2.

Some embodiments of the inventive concept may provide a universal driver system that can drive an electrical circuit device under test, such as a power semiconductor device, without the need to design a custom driver circuit for the device under test. As a result, design and implementation effort in designing driver test systems when developing a new power converter design, for example, may be reduced. A user may be provided with great flexibility in configuring the universal driver system through the use of programmable switches to connect a variety of different voltage sources and impedances to output ports that are configured to couple to a device under test. As a result, a variety of different voltage levels and impedance configurations may be quickly programmed and applied to the device under test. Thus, in the product test and debugging phase of a development project, the universal gate driver may provide the user with the capability of fine-tuning the performance of, for example, a switched power semiconductor device, to meet the needs of a specific application.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit" "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A system, comprising:
a controller that is configured to generate a plurality of switch control signals;
a plurality of electrical circuit elements, the plurality of electrical circuit elements being characterized by a plurality of impedances, respectively;
a plurality of voltage sources; and
a plurality of switches that are programmable to couple the plurality of electrical circuit elements to the plurality of voltage sources responsive to the plurality of switch control signals;
wherein a first subset of the plurality of circuit elements is coupled to a first output node and a second subset of the plurality of circuit elements is coupled to a second output node;
wherein the first output node and the second output node are configured to couple to a device under test; and
wherein the first output node is configured to couple to a gate terminal of the device under test and the second output node is configured to couple to a source terminal of a device under test.

2. The system of claim 1,
wherein a first subset of the plurality of switches are programmable to couple the first subset of the plurality of circuit elements to a first subset of the plurality of voltage sources responsive to a first subset of the plurality of switch control signals; and
wherein a second subset of the plurality of switches are programmable to couple the second subset of the plurality of circuit elements to a second subset of the plurality of voltage sources responsive to a second subset of the plurality of switch control signals.

3. The system of claim 1, further comprising:
a plurality of bypass switches coupled in parallel with the plurality of electrical circuit elements, respectively, each of the plurality of bypass switches being programmable in first and second states responsive to a bypass subset of the plurality of switch control signals;
wherein respective ones of the plurality of electrical circuit elements are electrically removed when respective ones of the plurality of bypass switches are in the first state.

4. The system of claim 1, wherein the plurality of switches comprises element configuration switches that are programmable to couple ones of the plurality of electrical circuit elements to each other in series and in parallel responsive to an element configuration subset of the plurality of switch control signals.

5. The system of claim 1, wherein each of the plurality of impedances comprises a resistance, a capacitance, an inductance, a combination of resistance and capacitance, a combination of capacitance and inductance, or a combination of resistance, capacitance, and inductance.

6. The system of claim 1, wherein the plurality of switches are programmable to couple one of the plurality of electrical circuit elements to one of the plurality of voltage sources in a voltage source driver configuration responsive to the plurality of switch control signals being in a voltage source configuration state.

7. The system of claim 6, wherein the one of the plurality of circuit elements comprises a circuit including a resistor, a capacitor, an inductor, a combination of the resistor and the capacitor, a combination of the resistor and the inductor, a combination of the capacitor and the inductor, or a combination of the resistor, the capacitor, and the inductor; and
wherein the one of the plurality of circuit elements is coupled to the one of the plurality of voltage sources.

8. The system of claim 6, wherein a combination of the plurality of circuit elements comprises a resistor and a capacitor, the resistor and an inductor, the capacitor and the inductor, or the resistor, the inductor, and the capacitor; and
wherein the combination of the plurality of circuit elements is coupled to one of the plurality of voltage sources.

9. The system of claim 1, wherein the plurality of switches are programmable to selectively couple one of the plurality of electrical circuit elements to the plurality of voltage sources and to an output node in a multi-state current source driver configuration responsive to the plurality of switch control signals transitioning between a plurality of current source configuration states.

10. The system of claim 9, wherein the one of plurality of circuit elements comprises an inductor; and
wherein the inductor is coupled to one of the plurality of voltages sources and is configured to establish a current therethrough during a first portion of the plurality of current source configuration states; and
wherein the inductor is coupled to an output node and is configured to discharge the current through the output node during a second portion of the plurality of current source configuration states.

11. The system of claim 10, wherein the inductor is decoupled from the one of the plurality of voltage sources during a third portion of the plurality of current source configuration states.

12. The system of claim 11, wherein the third portion of the plurality of current source configuration states corresponds to a voltage at the output node being approximately equal to a voltage of the one of the plurality of voltage sources.

13. A method, comprising:
generating a plurality of switch control signals; and programming a plurality of switches to couple a plurality of electrical circuit elements to a plurality of voltage sources responsive to the plurality of switch control signals, the plurality of electrical circuit elements being characterized by a plurality of impedances, respectively;

wherein a first subset of the plurality of circuit elements is coupled to a first output node and a second subset of the plurality of circuit elements is coupled to a second output node;

wherein the first output node and the second output node are configured to couple to a device under test; and wherein the first output node is configured to couple to a gate terminal of the device under test and the second output node is configured to couple to a source terminal of a device under test.

14. The method of claim 13, further comprising:

programming a first subset of the plurality of switches to couple the first subset of the plurality of circuit elements to a first subset of the plurality of voltage sources responsive to a first subset of the plurality of switch control signals; and programming a second subset of the plurality of switches to couple the second subset of the plurality of circuit elements to a second subset of the plurality of voltage sources responsive to a second subset of the plurality of switch control signals.

15. The method of claim 13, further comprising:

coupling a plurality of bypass switches in parallel with the plurality of electrical circuit elements, respectively, each of the plurality of bypass switches being programmable in first and second states responsive to a bypass subset of the plurality of switch control signals;

wherein respective ones of the plurality of electrical circuit elements are electrically removed when respective ones of the plurality of bypass switches are in the first state.

16. The method of claim 13, wherein the plurality of switches comprises element configuration switches, the method further comprising:

programming the element configuration switches to couple ones of the plurality of electrical circuit elements to each other in series and in parallel responsive to an element configuration subset of the plurality of switch control signals;

wherein each of the plurality of impedances comprises a resistance, a capacitance, an inductance, a combination of resistance and capacitance, a combination of capacitance and inductance, or a combination of resistance, capacitance, and inductance.

17. A computer program product, comprising:

a non-transitory computer readable storage medium comprising computer readable program code embodied in the medium that is executable by a processor to perform operations comprising:

generating a plurality of switch control signals; and programming a plurality of switches to couple a plurality of electrical circuit elements to a plurality of voltage sources responsive to the plurality of switch control signals, the plurality of electrical circuit elements being characterized by a plurality of impedances, respectively;

wherein a first subset of the plurality of circuit elements is coupled to a first output node and a second subset of the plurality of circuit elements is coupled to a second output node;

wherein the first output node and the second output node are configured to couple to a device under test; and wherein the first output node is configured to couple to a gate terminal of the device under test and the second output node is configured to couple to a source terminal of a device under test.

18. The computer program product of claim 17, wherein the operations further comprise:

programming a first subset of the plurality of switches to couple the first subset of the plurality of circuit elements to a first subset of the plurality of voltage sources responsive to a first subset of the plurality of switch control signals; and programming a second subset of the plurality of switches to couple the second subset of the plurality of circuit elements to a second subset of the plurality of voltage sources responsive to a second subset of the plurality of switch control signals.

19. The computer program product of claim 17, wherein the operations further comprise:

coupling a plurality of bypass switches in parallel with the plurality of electrical circuit elements, respectively, each of the plurality of bypass switches being programmable in first and second states responsive to a bypass subset of the plurality of switch control signals;

wherein respective ones of the plurality of electrical circuit elements are electrically removed when respective ones of the plurality of bypass switches are in the first state.

20. The computer program product of claim 17, wherein the plurality of switches comprises element configuration switches, the operations further comprising:

programming the element configuration switches to couple ones of the plurality of electrical circuit elements to each other in series and in parallel responsive to an element configuration subset of the plurality of switch control signals;

wherein each of the plurality of impedances comprises a resistance, a capacitance, an inductance, a combination of resistance and capacitance, a combination of capacitance and inductance, or a combination of resistance, capacitance, and inductance.

* * * * *